United States Patent
Ker et al.

(10) Patent No.: US 7,283,342 B1
(45) Date of Patent: Oct. 16, 2007

(54) HIGH-VOLTAGE TOLERANT POWER RAIL ELECTROSTATIC DISCHARGE CLAMP CIRCUIT

(75) Inventors: Ming-Dou Ker, Hsinchu (TW); Wen-Yi Chen, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/428,571

(22) Filed: Jul. 5, 2006

(51) Int. Cl.
*H02H 9/00* (2006.01)
*H02H 3/20* (2006.01)
*H02H 3/22* (2006.01)

(52) U.S. Cl. .................. 361/56; 361/91.1; 361/111

(58) Field of Classification Search .................. 361/56, 361/91.1, 91.3, 91.5, 111
See application file for complete search history.

(56) References Cited

U.S. PATENT DOCUMENTS

| | | | |
|---|---|---|---|
| 5,530,612 A | 6/1996 | Maloney | |
| 5,654,862 A | 8/1997 | Worley et al. | |
| 5,719,737 A | 2/1998 | Maloney | |
| 5,780,897 A | 7/1998 | Krakauer | |
| 5,930,094 A | 7/1999 | Amerasekera | |
| 5,956,219 A * | 9/1999 | Maloney | 361/56 |
| 6,747,861 B2 | 6/2004 | Ker et al. | |
| 6,867,957 B1 | 3/2005 | Tong et al. | |
| 7,203,045 B2 * | 4/2007 | Chatty et al. | 361/91.1 |
| 7,230,806 B2 * | 6/2007 | Poon et al. | 361/56 |

OTHER PUBLICATIONS

Timothy J. Maloney, Novel Clamp Circuits for IC Power Supply Protection, IEEE Transactions on Components, and Manufacturing Technology, Part C, vol. 19, No. 3, Jul. 1996.

* cited by examiner

*Primary Examiner*—Michael Sherry
*Assistant Examiner*—Tien Mai
(74) *Attorney, Agent, or Firm*—Ming Chow; Sinorica, LLC

(57) ABSTRACT

A high-voltage tolerant power-rail ESD clamp circuit is proposed, in which circuit devices can safely operate under the high power supply voltage that is three times larger than their process limitation without gate-oxide reliability issue. Moreover, an ESD detection circuit is used to effectively improve the whole ESD protection function by substrate-triggered technique. Because only low voltage (1*VDD) devices are used to achieve the object of high voltage (3*VDD) tolerance, the proposed design provides a cost effective power-rail ESD protection solution to chips with mixed-voltage interfaces.

18 Claims, 8 Drawing Sheets

HIGH-VOLTAGE TOLERANT POWER RAIL ELECTROSTATIC DISCHARGE CLAMP CIRCUIT

BACKGROUND OF THE INVENTION

1. Field of the Invention

The present invention relates to an ESD clamp circuit and, more particularly, to a high-voltage tolerant power-rail ESD clamp circuit.

2. Description of Related Art

ESD protection is used to protect ICs from damage due to ESD events. When applied to a mixed-voltage IO interface, because there simultaneously exists more than two power supply voltages on this interface, both thin and thick gate oxide devices are usually simultaneously used with the considerations on product reliability, operating frequency, chip area, and so on. Though ICs with mixed-voltage circuits can be manufactured with both thin and thick gate-oxide devices by using extra process steps and additional mask layers, but they will increase the product cost and lower the production yield. Moreover, a thick-gate-oxide device has inferior device characteristics than that of the thin one, so that the operating frequency of chips will be limited. Therefore, if thin-gate-oxide devices can be applied under high operating voltages without reliability issue, the steps of manufacturing thick-gate-oxide devices can be saved.

Existing technologies relating to high-voltage-tolerant ESD protection can generally be categorized into three kinds. The first kind is an ESD protection element without gate-oxide structure. Because this kind of devices has no gate oxide, the gate oxide issue won't arise even if the operating voltage exceeds process limitation. But if this kind of device is used alone as the ESD protection element, the turn-on speed will be slower and the turn-on voltage will be higher during ESD, hence being unable to effectively protect internal circuits with thin gate oxides. If a forward-biased diode string is used as the ESD protection element, although a faster turn-on speed can be achieved, there will be a very large leakage current during operation under high temperatures because of parasitic pnp BJTs and Darlington beta gain. The second kind has a trigger circuit and an ESD clamp circuit of the primary ESD protection element. But this kind of devices can only tolerate a maximum power supply voltage, no more than two times of their device limitation. Most of the prior arts belong to this kind, e.g., an ESD protection element manufactured with 1.2-V devices but operated under 2.5-V power supply voltage. If the power supply voltage exceeds two times of their device limitation, the gate-oxide reliability issue of device will arise. Similar to the second kind, the third kind has a trigger circuit and an ESD architecture of the primary ESD protection element, but can tolerate a power supply voltage three times of their device limitation.

The above third kind of ESD (e.g., "High voltage power supply clamp circuitry for electrostatic discharge (ESD) protection" disclosed in U.S. Pat. No. 5,956,219) has a complicated circuit, and utilizes three stacked PMOS elements as the primary ESD path, hence having a larger turn-on resistance. In order to acquire a better ESD protection capability, a larger chip area is required, and different ESD elements cannot be matched for use, hence being less flexible. Although other ESD protection elements without gate oxide such as silicon-controlled rectifiers (SCRs) can operate under high power supply voltages without oxide gate reliability issue, these elements usually have a very slow turn-on speed and a too high turn-on voltage, and cannot effectively protect the chip circuits when used alone without being triggered by external circuits. Moreover, existing trigger circuits cannot operate under a power supply voltage three times of their device limitation.

The present invention aims to propose a high-voltage tolerant power-rail ESD clamp circuit to solve the above problems in the prior art.

SUMMARY OF THE INVENTION

An object of the present invention is to provide a high-voltage tolerant power-rail ESD clamp circuit, in which an ESD detection circuit is used to provide a substrate-triggered current to an ESD protection element when an ESD event occurs so as to enhance the turn-on speed and turn-on uniformity.

Another object of the present invention is to provide a high-voltage tolerant power-rail ESD clamp circuit, in which the ESD detection circuit can match different ESD protection elements for use to meet different applications or specifications.

Another object of the present invention is to provide a high-voltage tolerant power-rail ESD clamp circuit, in which there won't be any gate-oxide reliability issue when applying the ESD detection circuit to mixed-voltage IO interfaces.

To achieve the above objects, the present invention provides a high-voltage tolerant power-rail ESD clamp circuit, which comprises an ESD detection circuit and an ESD protection element. The ESD detection circuit is connected to at least a voltage source and a ground terminal and used to detect whether there is ESD between the voltage source and the ground terminal. The ESD detection circuit further comprises a voltage divider for splitting an input voltage of the voltage source into two divided voltages, a substrate driver for driving a substrate to produce a trigger current, an RC distinguisher, a fourth transistor and a second resistor. The ESD protection element is triggered on via the trigger current of the trigger node by the ESD detection circuit to quickly and uniformly discharge an ESD current in an ESD situation, hence having no gate-oxide reliability issue.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

The present invention provides a high-voltage tolerant power-rail ESD clamp circuit, in which a substrate-triggered current is provided to drive different ESD protection elements under ESD stress. The substrate-triggered current has been reported to be beneficial to many ESD protection devices, such as the STNMOS (substrate-triggered NMOS) device, the SCR device, and the FOD (field oxide) device. The substrate-triggered current can improve ESD robustness of these ESD protection devices by increasing their turn-on speed and turn-on uniformity under ESD stress.

Figure 1:
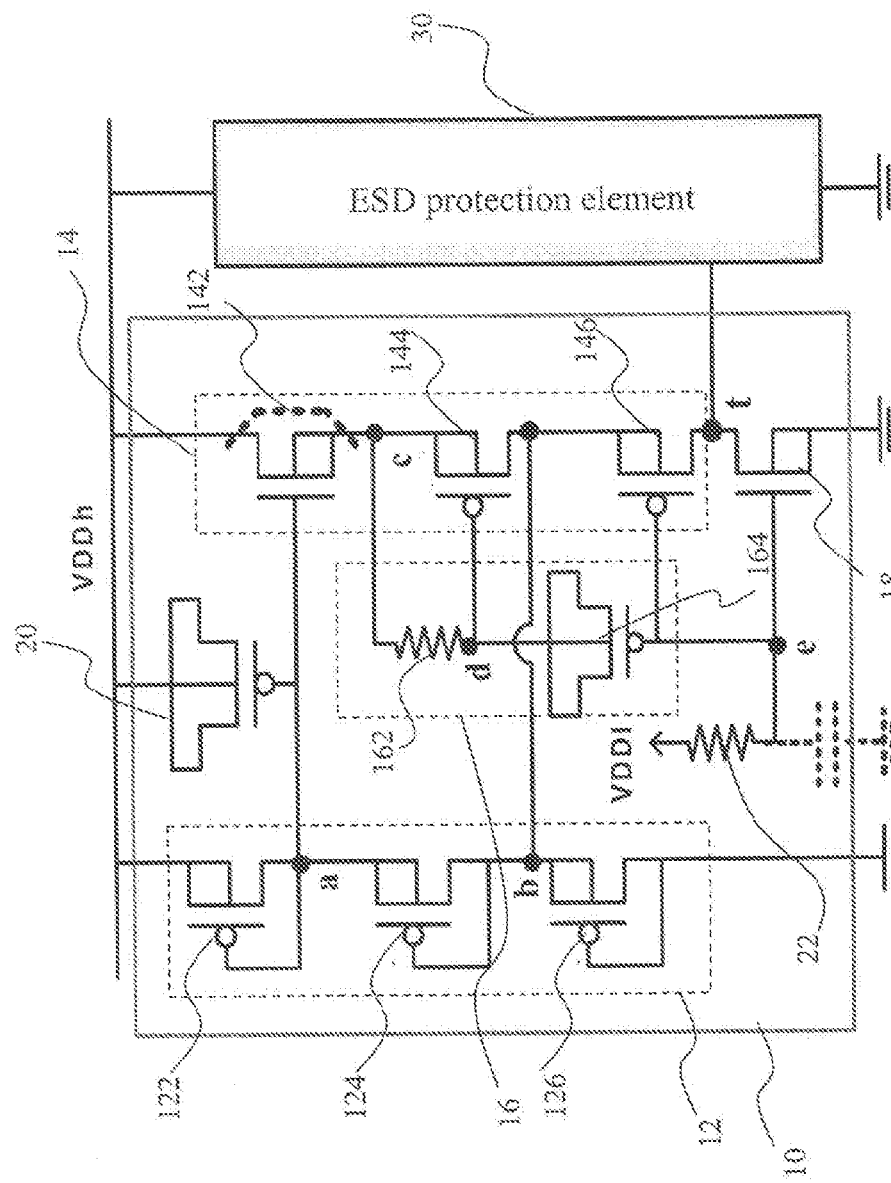
FIGS. 1 and 2 are circuit diagrams of the high-voltage tolerant power-rail ESD clamp circuit of the present invention.

As shown in FIG. 1, a power-rail ESD clamp circuit of the present invention comprises two voltage sources VDDh and VDD1, an ESD detection circuit 10 and an ESD protection element 30. The ESD detection circuit 10 is composed of a voltage divider 12, a substrate driver 14, an RC distinguisher 16, a fourth transistor 18, a fifth transistor 20 and a second resistor 22. The voltage divider 12 includes three p-type transistors 122, 124 and 126 for splitting an input voltage of the high voltage source VDDh into two divided voltages. The substrate driver includes a first transistor 142, a second transistor 144 and a third transistor 146. The RC distinguisher includes a first resistor 162 and a capacitor 164. The first, second and third transistors 142, 144 and 146 are an NMOS and two PMOS, respectively. The first transistor 142 is a deep N-well MOS transistor. The fourth transistor 18 is an NMOS and capable of enhancing the noise margin of the ESD detection circuit 10 to ensure that the ESD protection element 30 won't be improperly triggered. The fifth transistor 20 can enhance the efficiency and stability of the ESD detection circuit 10. The fifth transistor 20 is a PMOS. The second resistor 22 is connected to the low voltage source VDD1. All the devices in the ESD detection circuit 10 are 1.2-V low-voltage devices. The VDDh is a 3.3-V high voltage power supply, and the VDD1 is a 1.2-V low voltage power supply. There exists a trigger node t between the ESD detection circuit 10 and the ESD protection element 30.

Figure 2:
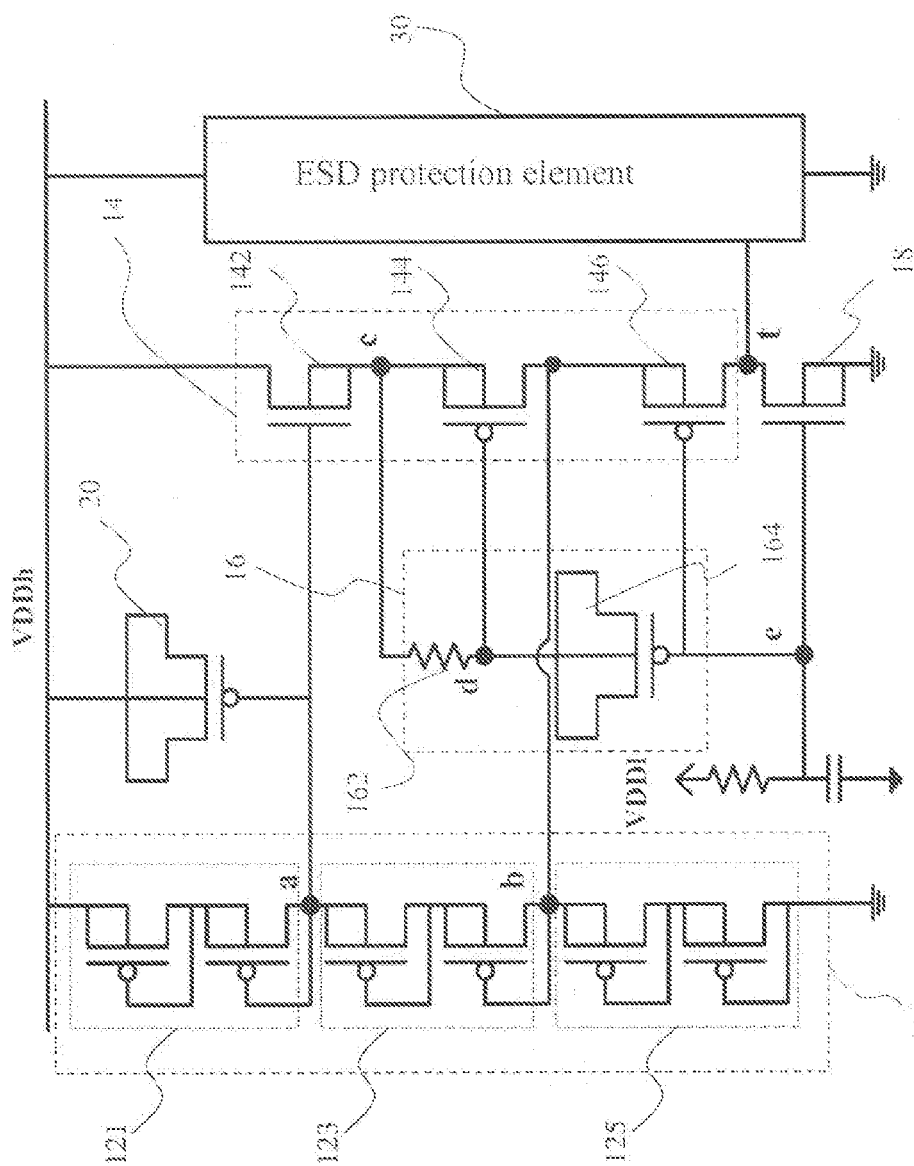

As shown in FIG. 2, the voltage divider 12 can also include six PMOS. Two of the six PMOS are viewed as a pair, and there are totally three PMOS pairs 121, 123 and 125 that make up the voltage divider 12. A node a exists between the PMOS pair 121 and the PMOS pair 123, and a node b exists between the PMOS pair 123 and the PMOS pair 125. The node a and node b are output nodes of the voltage divider 12.

When the high voltage source VDDh and the low voltage source VDD1 are powered on, the gate of the first transistor 142 will get a 2.2-V bias (⅔*VDDh) from the node a of the voltage divider 12, and the bias of the second transistor 144 is 2.2-V minus the threshold voltage of the first transistor 142. With a gate-to-source bias of 0V, the second transistor 144 should be kept off. The source voltage of the third transistor 146 which is the same as the voltage on node b is biased at 1.1V (⅓*VDDh) through the voltage divider, while its gate (node e in FIG. 3) is biased at VDD1 of 1.2V the same as node e. Therefore, with a negative source-to-gate bias, the third transistor 146 is also kept off during the normal circuit operation. As a result, the substrate driver 14 works in off state after the normal power-on transition, providing no trigger current into the trigger node t.

Figure 3:
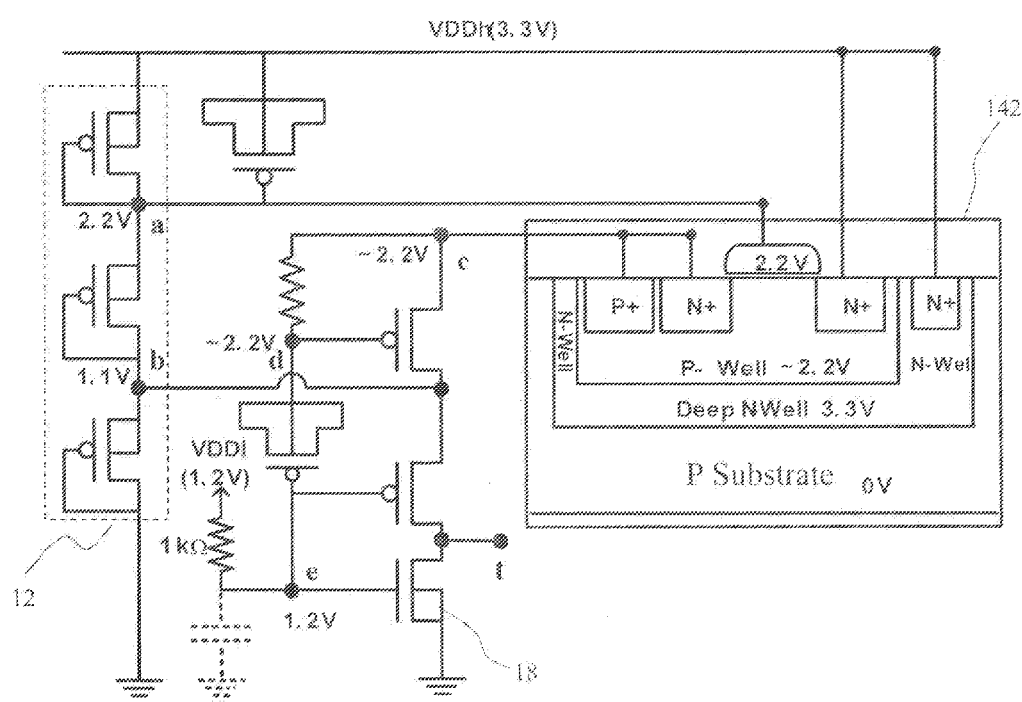
FIG. 3 is a cross sectional view with the Hspice simulated voltages for nodes of the ESD detection circuit under the normal circuit operation of the present invention when the high power supply voltage is 3.3V.

In this ESD detection circuit 10, the drain-to-gate voltage of the first transistor 142 is (3.3-2.2)V, which means the first transistor 142 is working at inversion region under the normal circuit operating conditions. Therefore, the induced channel region of the first transistor 142 could be insufficient to shade the strength of the electric field across the gate/bulk junctions if its bulk region is grounded. In other words, there could be gate-oxide reliability issue on the gate of the first transistor 142 if its bulk is grounded. Therefore, to avoid this possible issue, bulk of the first transistor 142 is connected to the source node of its own. To avoid the leakage current path through the p-type bulk of the first transistor 142 to the grounded p-substrate, the bulk of the first transistor 142 is isolated by the deep N-well with 3.3-V bias from the common p-substrate, as the diagram in FIG. 3 shows. Deriving from the analysis of Hspice, voltages on nodes of the ESD detection circuit 10 during normal circuit operating condition are also labeled on the diagram in FIG. 4. The first transistor 142 has a source voltage close to its gate voltage. From these simulated voltages, it can be clearly seen that voltages between every two adjacent nodes of devices do no exceed their voltage extreme (1.32V for 1.2-V devices). Therefore, though the power-rail ESD clamp circuit has high power supply voltage of 3.3V, it is free from the gate-oxide reliability issue.

Figure 4:
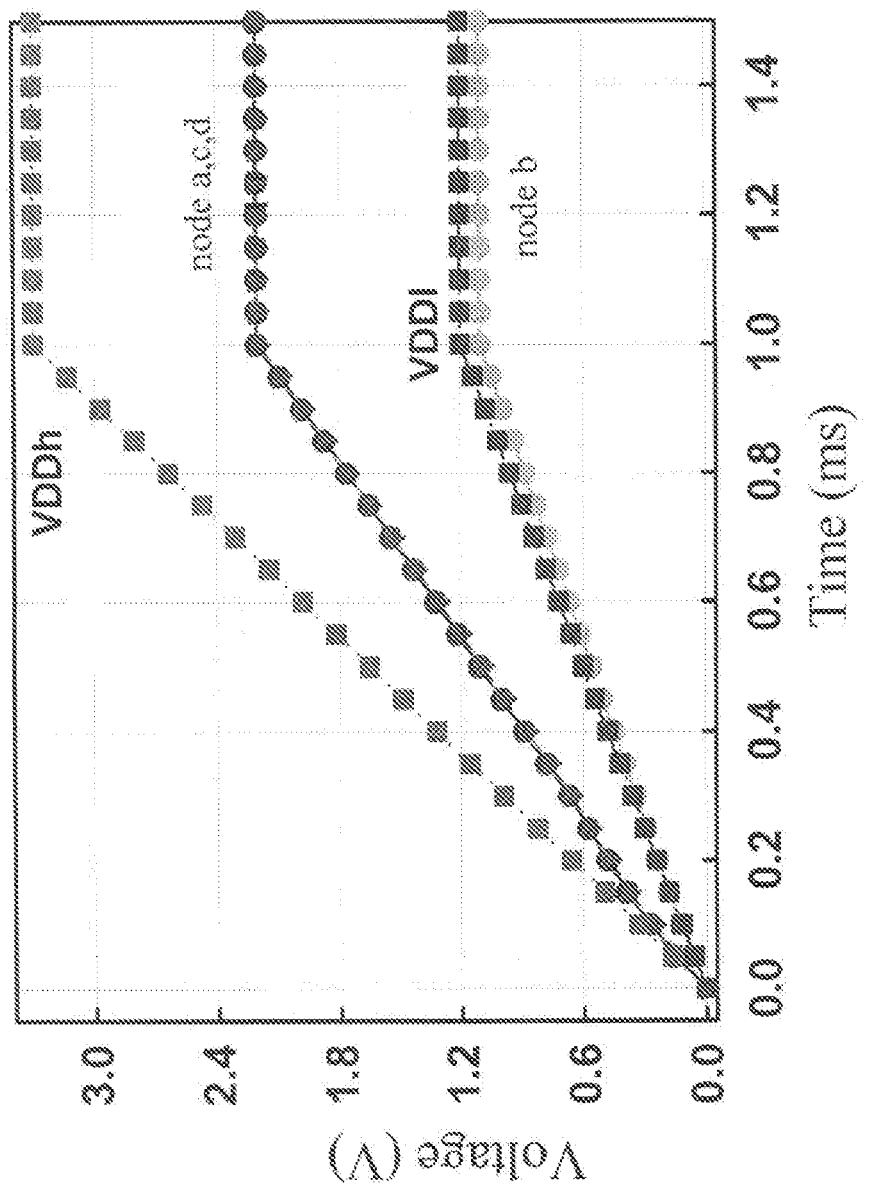
FIG. 4 is a diagram showing the Hspice simulation for nodes of the ESD detection circuit under normal power-on transition with a signal rise time of 1 ms.

During the power-on transition, the ESD detection circuit 10 should be kept off so that the ESD detection circuit 10 does not improperly trigger on the ESD protection element 30 or result in unwished leakage current from the substrate driver 14. This can be achieved through taking advantage of the rise time of normal power-on signals, which are in the order of several milliseconds (ms). Therefore, as long as the RC time delay of the RC distinguisher 16 is much smaller than several milliseconds (several microseconds for example), the voltage on node d can follow up the voltage transition on node c to turn off the second transistor 144 during normal power-on transition. FIG. 4 shows the Hspice simulated voltages on nodes of the ESD detection circuit when VDDh and VDD1 are powered on to 3.3V and 1.2V, respectively. VDDh and VDD1 have the same signal rise time of 1 ms in this simulation. Simulation result shows that the gate voltage of the second transistor 144 (node d) can follow up its source voltage (node c) to turn off the substrate driver 14. Therefore, the substrate driver 14 is therefore safely kept at off state during the normal power-on transition.

As shown in FIG. 1, when ESD transient voltage is applied access VDDh and the ground terminal, the substrate driver 14 has to provide the substrate-triggered current into the trigger node as fast as possible, so that the primary ESD protection element 30 can be quickly triggered on to protect the internal circuits from ESD damage. Since the ESD transient voltages have characteristics of the fast pulse rise time (several nanoseconds) and short duration (several hundreds of nanoseconds), the voltage divider 10 is not fast enough to pull up the gate voltage of the first transistor 142 during ESD transition. Therefore, the fifth transistor 20 as a capacitor is needed to enhance the turn-on speed of the first transistor 142 under ESD transition.

After the first transistor 142 is turned on, voltage on node c is pulled high while voltage on node d is kept low due to the RC time delay of the RC distinguisher 16. During ESD transient events, the floating VDD1 has an initial voltage level around ~0 V; the large parasitic capacitance of internal circuits on VDD1 power line and the 1 kΩ resistor will keep VDD1 at low voltage level during ESD transition for a long while. Therefore, because the second transistor 144 and the third transistor 146 work at on state during the ESD transition, the substrate driver 14 can be quickly turned on by the ESD energy to generate the trigger current into the primary ESD protection element 30.

Figure 5:
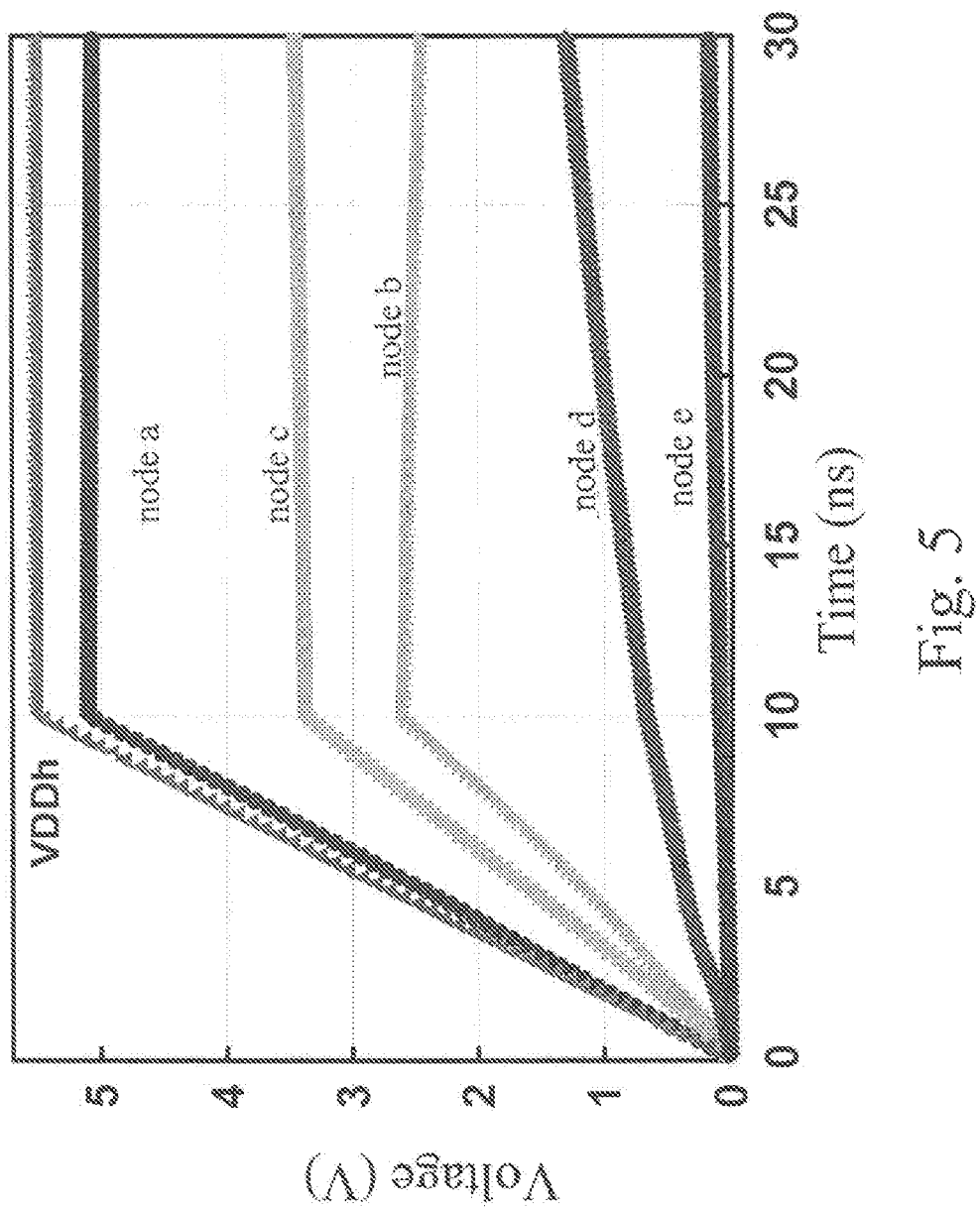
FIG. 5 is a diagram showing the Hspice simulation for nodes of the ESD detection circuit under 0-to 5.5V ESD-like voltage pulse on the high power supply with a rise time of 10 ns.
Figure 6:
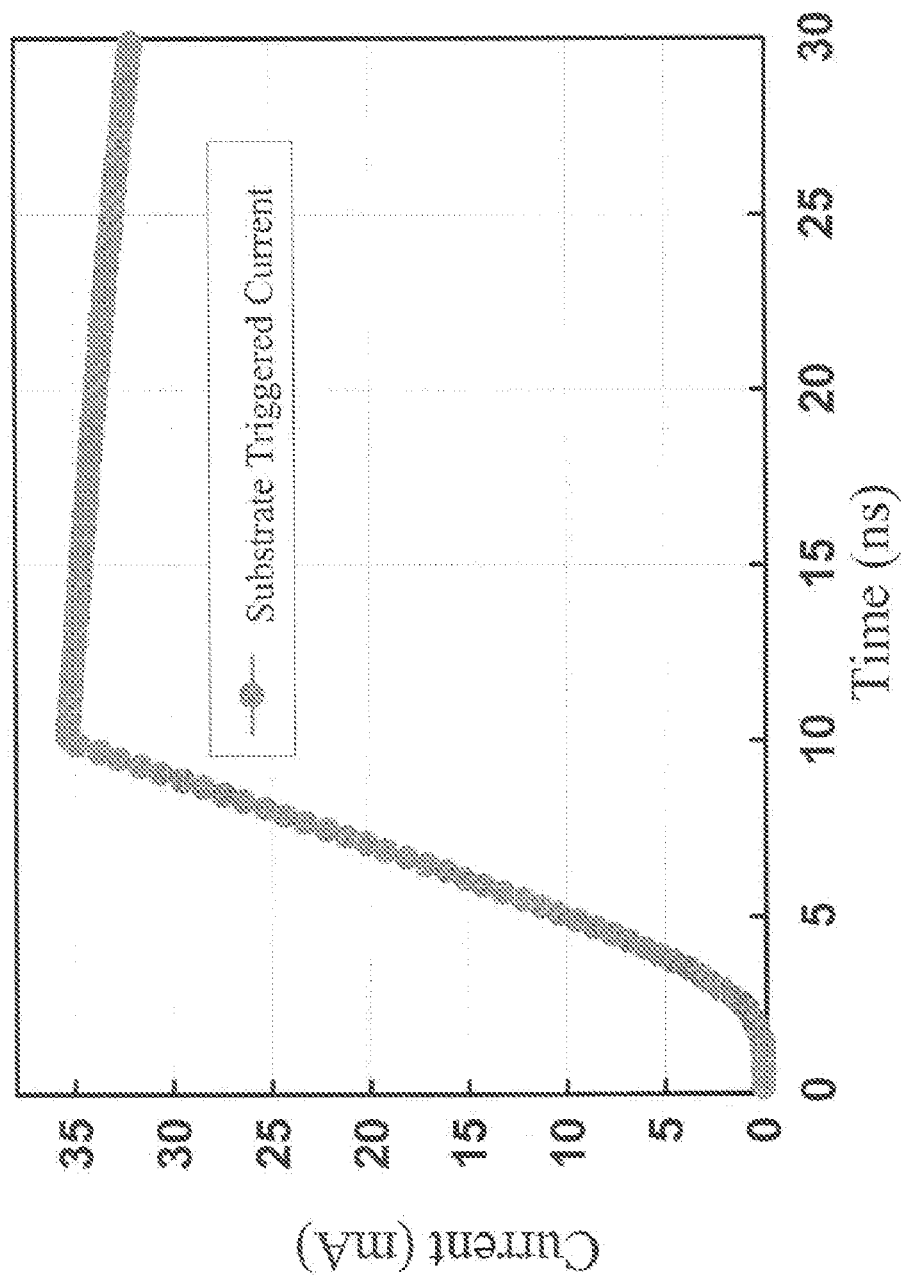
FIG. 6 is a diagram showing the driving capability of the new proposed ESD detection circuit under 0-to-5.5V ESD-like transition with a rise time of 10 ns (same conditions as those in FIG. 5)

FIG. 5 shows the Hspice-simulated voltages of the ESD detection circuit 10 under ESD transition. A 0-to-5.5V ESD-like voltage pulse with rise time of 10 ns is applied to the VDDh to simulate the ESD transient voltage. The Hspice-simulated results show that the gate voltage of the first transistor 142 (node a) is quickly pulled high through the capacity coupling of the fifth transistor 20 and the gate voltage of the second transistor 144 (node d) is kept low due to the time delay of the RC distinguisher 16. The substrate driver 14 can provide the substrate-triggered current around ~35 mA within 10 ns, as shown in FIG. 6. By adjusting the device dimensions of the substrate driver 14, magnitude of the triggered current can be designed to meet different applications or specifications.

Figure 7D:
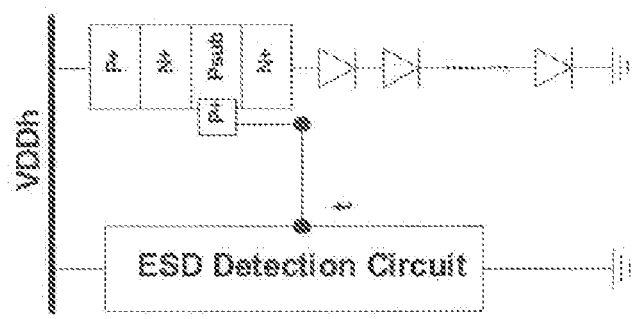
FIGS. 7(a) to 7(e) are diagrams of the primary ESD protection element according to different embodiments of the present invention: (a) Field-oxide device (FOD), (b) SCR device, (c) stacked SCR devices, (d) SCR device with diodes in series, and (e) triple stacked NMOS structure.
Figure 7C:
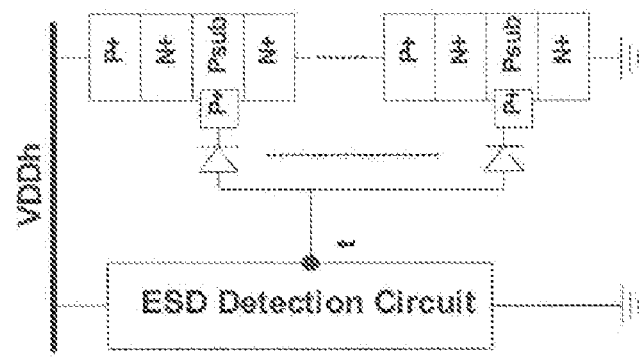
Figure 7B:
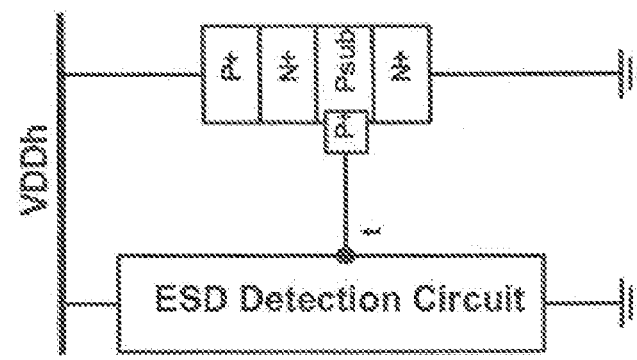
Figure 7A:
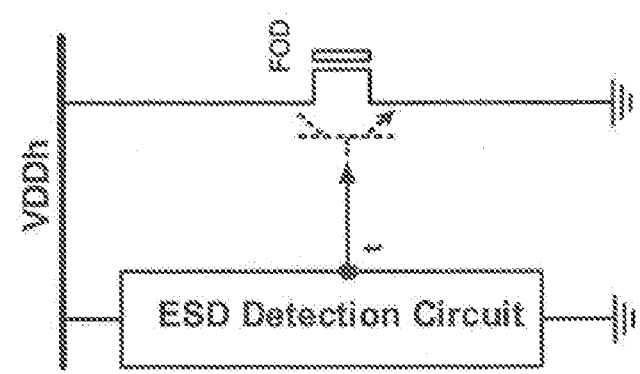
Figure 7E:
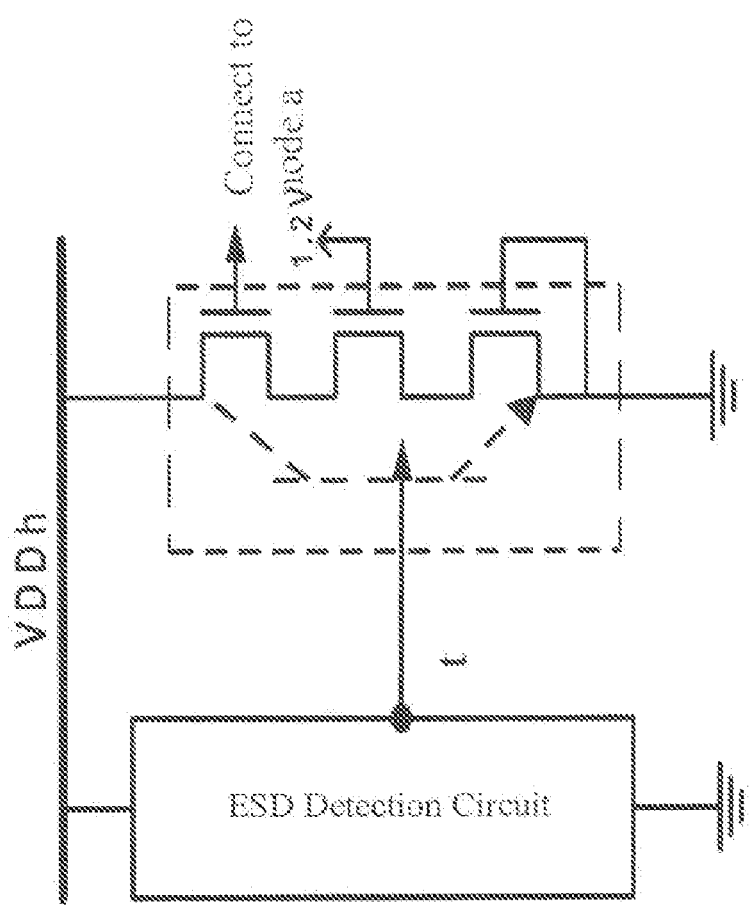

FIGS. 7(a) to 7(e) show some embodiments of the primary ESD protection element 30. Devices with inherent n-p-n bipolar junction transistor can be driven by the proposed ESD detection circuit to protect the ICs against ESD damage. For example, the FOD (field oxide) device that has no gate oxide structure is a choice for the primary ESD protection element, as shown in FIG. 7(a). Another embodiment of the primary ESD protection element is the SCR device, as shown in FIG. 7(b). To increase the overall holding voltage for latch up issue, SCR devices can be stacked together, as shown in FIG. 7(c). The number of stacked SCR devices can be increased for higher holding voltage. Diodes between the trigger node and the p$^+$ node of SCR in FIG. 7(c) can prevent ESD current flowing out of the SCR device from the p$^+$ node of the first SCR into the p$^+$ node of the last SCR through the metal connection. The overall holding voltage of SCR device can also be increased by being stacked with different number of diodes under SCR device, as shown in FIG. 7(d). A parasitic n-p-n transistor composed of a triple stacked NMOS structure is another embodiment for the ESD protection element, as shown in FIG. 7(e). To lower the strength of electric field on each NMOS device, gate voltages of the top and the middle NMOS have to be properly biased under VDDh. Gate of the top NMOS is connected to node a of the ESD detection circuit, and gate of the middle NMOS is biased at VDD1 in this embodiment.

To sum up, the present invention provides a three-voltage tolerant power-rail ESD clamp circuit realized with only 1.2-V low-voltage devices for 1.2-V/3.3-V mixed-voltage I/O interface. The proposed power-rail ESD clamp circuit is free from the gate-oxide reliability issue and the ESD detection circuit can be quickly turned on to provide the substrate-triggered current so as to drive the ESD protection element to discharge ESD current during the ESD transition.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

FIGURE REFERENCE NUMERALS

10: ESD detection circuit
12: voltage divider
   121, 122, 123, 124, 125, 126: PMOS
14: substrate driver
   142: first transistor
   144: second transistor
   146: third transistor
16: R-C distinguisher
   162: first resistor
   164: capacitor
18: fourth transistor
20: fifth transistor
22: second resistor
30: ESD protection element Index FIGS. 1 and 2

30: ESD protection element

FIG. 3

P 型基板: p-type substrate

FIGS. 4 and 5

電壓: voltage

時間: time

節點: node

FIG. 6

電流: current

時間: time

基板觸發電流: substrate-triggered current

FIG. 7

靜電放電偵測電路: ESD detection circuit

連接至a 節點: connected to a node a

We claim:

1. A power-rail ESD clamp circuit with high-voltage tolerant capability comprising:
an ESD detection circuit connected to at least a voltage source and a ground terminal and used to detect whether there is ESD between said voltage source and said ground terminal, said ESD detection circuit further comprising:
a voltage divider including a plurality of p-type transistors to split an input voltage of said voltage source into two divided voltages;
a substrate driver connected with said voltage divider and used to drive a substrate to produce a trigger current, said substrate driver including a first transistor, a second transistor and a third transistor, a first node being located between said first transistor and said second transistor, said third transistor being connected to a trigger node;
an RC distinguisher including a first resistor and a capacitor, one end of said first resistor being connected to said first node, and another end being connected to a gate of said second transistor and said capacitor to form a second node;
a fourth transistor connected to said substrate driver via said trigger node and to said RC distinguisher via a third node; and
a second resistor with one end connected to said third node and another end connected to a low voltage source;

an ESD protection element triggered on via said trigger current of said trigger node by said ESD detection circuit to quickly and uniformly discharge an ESD current in an ESD situation.

2. The power-rail ESD clamp circuit of claim 1, wherein said voltage divider includes a plurality of p-type transistors.

3. The power-rail ESD clamp circuit of claim 1, wherein said voltage divider splits an input voltage of said voltage source into two divided voltages.

4. The power-rail ESD clamp circuit of claim 1, wherein said first transistor in said substrate driver is an NMOS transistor, and said second and third transistors are PMOS transistors.

5. The power-rail ESD clamp circuit of claim 4, wherein said first transistor is a deep N-well MOS transistor.

6. The power-rail ESD clamp circuit of claim 1, wherein said capacitor is composed of PMOS transistor.

7. The power-rail ESD clamp circuit of claim 1, wherein when said first node and said second node have equal voltages, said second transistor will be off to let said ESD detection circuit not trigger said ESD protection element.

8. The power-rail ESD clamp circuit of claim 1, wherein when said first transistor is on, voltage of said first node will keep at a low voltage level due to an RC time delay of said RC distinguisher to raise voltage of said second node.

9. The power-rail ESD clamp circuit of claim 1, wherein when an ESD event instantaneously occurs and said second and third transistors operate under the ESD event, said substrate driver will be quickly turned on by energy of ESD to produce said trigger current that flows from said trigger node into said ESD protection element.

10. The power-rail ESD clamp circuit of claim 1, wherein a bulk region of said first transistor is connected to a source node of said first transistor.

11. The power-rail ESD clamp circuit of claim 1, wherein when said first transistor is turned on, voltage of said first node will be higher than that of said second node due to an RC time delay of said RC distinguisher so as to let said substrate driver send out a trigger current that flows into said ESD protection element.

12. The power-rail ESD clamp circuit of claim 1, wherein when said fourth transistor is turned on, a noise margin of said ESD detection circuit is increased.

13. The power-rail ESD clamp circuit of claim 1, wherein said ESD detection circuit further comprises a fifth transistor that is disposed between said voltage divider and said first transistor and used as a capacitor.

14. The power-rail ESD clamp circuit of claim 1, wherein said ESD protection element is a field oxide device without a gate oxide structure.

15. The power-rail ESD clamp circuit of claim 1, wherein said ESD protection element is a silicon-controlled rectifier.

16. The power-rail ESD clamp circuit of claim 1, wherein said ESD protection element is formed by stacking a plurality of silicon-controlled rectifiers, and diodes are provided between said trigger node and trigger nodes of said silicon-controlled rectifiers.

17. The power-rail ESD clamp circuit of claim 1, wherein said ESD protection element is formed by stacking a silicon-controlled rectifier and a plurality of diodes, and said trigger node is connected to a trigger point of said silicon-controlled rectifier.

18. The power-rail ESD clamp circuit of claim 1, wherein said ESD protection element is composed of three NMOS transistors, uppermost of said NMOS is connected to a first voltage dividing node in said voltage divider, and a gate of middle of said NMOS is biased at said low voltage source.

* * * * *